United States Patent
Kluth et al.

(10) Patent No.: US 7,084,075 B2
(45) Date of Patent: Aug. 1, 2006

(54) METHOD FOR PRODUCING A LAYER ON A SUBSTRATE

(75) Inventors: Patrick Kluth, Düsseldorf (DE); Quing-Tai Zhao, Jülich (DE); Siegfried Mantl, Jülich (DE)

(73) Assignee: Forschungszentrum Julich GmbH, Julich (DE)

( * ) Notice: Subject to any disclaimer, the term of this patent is extended or adjusted under 35 U.S.C. 154(b) by 61 days.

(21) Appl. No.: 10/496,850

(22) PCT Filed: Nov. 16, 2002

(86) PCT No.: PCT/DE02/04237

§ 371 (c)(1),
(2), (4) Date: Jun. 14, 2004

(87) PCT Pub. No.: WO03/046972

PCT Pub. Date: Jun. 5, 2003

(65) Prior Publication Data

US 2005/0042870 A1 Feb. 24, 2005

(30) Foreign Application Priority Data

Nov. 26, 2001 (DE) ................................ 101 57 627

(51) Int. Cl.
*H01L 21/31* (2006.01)
(52) U.S. Cl. ........................................ 438/770; 438/765
(58) Field of Classification Search ................. 438/770
See application file for complete search history.

(56) References Cited

U.S. PATENT DOCUMENTS

| | | | | |
|---|---|---|---|---|
| 4,765,169 A | * | 8/1988 | Bradlee | 72/160 |
| 6,309,975 B1 | | 10/2001 | Wu et al. | |
| 6,397,922 B1 | * | 6/2002 | Sachs et al. | 164/4.1 |

FOREIGN PATENT DOCUMENTS

| | | |
|---|---|---|
| DE | 198 53 023 | 5/2000 |
| EP | 0 831 521 | 3/1998 |
| WO | WO 01/69664 | 9/2001 |

OTHER PUBLICATIONS

"Si nanostructures formed by pattern-dependent oxidation" by Nagase et al. (Microelectr. Eng, 41/42 1998).
"Stress generation and relaxation in apssivating films . . ." by Gorokhov et al.(Materials Science Forum vol. 185-188 1995).

* cited by examiner

*Primary Examiner*—Thao P. Le
(74) *Attorney, Agent, or Firm*—Andrew Wilford

(57) ABSTRACT

The invention relates to a method for the production of structures in the nanometer range from larger, existing structures. An elastic strain field in generated in an already structured layer and optionally in a substrate. A strain-dependent diffusion and reaction process subsequently takes place, wherein the existing structure can be reduced in a reproducible manner by means of material transport.

15 Claims, 4 Drawing Sheets

METHOD FOR PRODUCING A LAYER ON A SUBSTRATE

CROSS REFERENCE TO RELATED APPLICATIONS

This application is a national stage of PCT/DE 2002/004237 filed 16 Nov. 2002 and based upon German national application 101 57 627.7 filed 26 Nov. 2001 under the International Convention.

FIELD OF THE INVENTION

The invention relates to a method of making a layer on a substrate. In this method initially the layer is formed on a substrate. In this layer, at least one structure is produced with first and second structure edges spaced apart from one another by a minimum distance x. This layer having this structure is further structured so that especially structures with structure edges having a spacing in the nanometer range are produced.

BACKGROUND OF THE INVENTION

For the production of structures in the nanometer range, optical lithography, among others, is used. In that case, with the aid of masking techniques, exposure is employed to transfer the desired structure to a photosensitive lacquer. The latter then serves as the mask for producing the ultimate structure. This conventional optical lithography enables a resolution of up to about 130 nanometers to be obtained. Methods with still better resolution, like x-ray lithography, electron beam lithography or deep-uv lithography are already known at a laboratory scale and require extensive technological efforts at high cost ®. (Kassing, R. Käsmeier, I. W. Rangelow, Physikalische Blätter, Vol. 56, 2000).

In microelectronics, the production of structures with dimensions of less than 100 nm is highly desirable. In semiconductor technology, such structures provide the basis for producing the smallest electronic components, for example, silicon MOSFETS. The extremely rapid advance of miniaturization of such components has required increasing development of chip technology. In the field of silicon technology, the requirements of future developments in components and the requisite dimensions of structuring have been given in "International Technology Roadmap for Semiconductors, Semiconductor Industry Association (http://public.itrs.net)".

The production of nanostructures and thus structures smaller than 100 nm plays an important role not only in microelectronics but is also a key step in nanotechnology generally. Here there is a great need for alternative fabrication techniques to eliminate the extreme costs and requirements of lithographic processes and to generate structures even within present day resolution limits.

Aside from the problem of producing the smallest structures in photolacquers, the problem of transfer of these structures to the underlying layers, usually achieved with etching processes have become increasingly problematical with decreasing dimensions, especially when one operates in the nanometer range since here the dimensions amount to only several atomic diameters.

In the case of silicon technology, among the materials used, silicides have been found to play a special role with respect to their electrical properties. They are used, for example, as contact materials and conducting materials in highly integrated circuits. A silicide of the greatest importance in microelectronics has been cobalt disilicide. The structuring of cobalt disilicide has been problematical or difficult in the past since, for that purpose, no standardized etching process exists. This is especially notable for the structuring of layers in the range smaller than 100 nm.

Methods which rely upon self-adjusting processes have been provided an alternative to structuring by means of lithography. From DE 195 03 641 A1, a method for structuring of silicide layers has become known which relies upon the local oxidation of silicides. With a self-adjusting process, for example, a cobalt disilicide layer can be divided into two regions.

A method of nanostructuring which relies upon a self-adjusting process is known from DE 198 53 023 A1. The method involves the formation of a submicrometer structured layer on a substrate whereby one layer is initially formed on a substrate. The means for creating elastic strain on at least one predetermined process of this layer is applied and then the layer is subjected to a solid body reaction which is a function of the strain. This gives rise to a separation of material and subsequently to a structuring of the layer at its position. The structure, depending upon the starting layer sequence, can have structure edges with a spacing of at least 30 to 50 nm. Smaller structures cannot be made in this way.

These structuring methods are disadvantageous because of their process-determined resolution limits. A change, especially a further reduction of the structure sizes produced by the method is not possible within these processes.

OBJECT OF THE INVENTION

It is the object of the invention, therefore, to provide a method which, with the aid of optional structuring procedures, can generate structures with at least locally or overall reduced dimensions. Especially a further reduction of submicrometer and nanometer structure is the subject of the invention.

SUMMARY OF THE INVENTION

The object is achieved by a method wherein a layer is initially formed on a substrate and in this layer at least one structure with first and second structure edges separated from one another by a minimum distance x is formed. According to the invention, in the region of at least the first structure edge, this edge is affected by an elastic strain field, and a strain-dependent diffusion or reaction process is carried out. Prior to the strain-dependent diffusion or reaction, the layer can be oxidized. The strain-dependent diffusion or reaction process can encompass a diffusion or heat treatment or specific alloy formation.

The layer can be structured with the aid of optical lithography or by a self-adjusting process. The method can be carried out for a sufficient length of time until the structure edges are spaced apart by a fixed but reduced spacing by comparison with the minimum space x, especially a spacing below 50 nm. Advantageously, the spacing of the structure edges can be 5, 10, 20, 30 or 40 nm or a value lying there between. The starting material for the layer can be at least one metal, especially Co, Ti, Ni, Pd, Pt, W, Ta or Nb or one or the silicides thereof. Preferably $CoSi_2$ is the material of the layer. According to a feature of the invention, also in the region of the second structure edge, this edge is affected by an elastic strain field. A mask structure can be used for producing the elastic strain field. $Si_3N_4$ and/or $SiO_2$ are preferred as materials for the formation of the mask structure, while SiO$_2$—Si$_3$N$_4$ are preferred as a layer sequence of the mask structure for producing the elastic strain field. The mask structure can overlap, especially slightly, the region of at least one of the structure edges. According to another feature of the invention the fabrication of the layer itself produces an elastic strain field. An electrical, optical, optoelectronic or sensory component can have a structured layer fabricated with the aid of the method described. The invention also comprises a layer sequence encompassing a layer on a substrate whereby at least one structure with a minimum spacing x of first and second structure edges is provided as well as a mask structure on the layer having that structure. The mask structure can overlap at least one structure edge, especially slightly.

The layer sequence can have a structure which overlaps, especially slightly, both structure edges.

According to the invention, therefore, a layer is initially formed on a substrate. In this layer, at least one structure is produced with first and second structure edges spaced apart from one another by a minimum distance x. The structure formed in this layer is then further structured, whereby in limited regions at least the first structure edge has this edge affected by an elastic strain field and thus a strain dependent diffusion or reaction process can be carried out.

As a result, the first structure edge grows by material transport in the direction of the second structure edge and brings about the desired reduction in the structure.

The reduction in the structure is possible because, with appropriate means, the elastic strain field can be produced in a previously strained layer and optionally in the substrate. Thereafter, the strain-dependent diffusion or reaction process is carried out.

Thus, a layer is initially formed on a substrate. In this layer, at least one structure is produced having first and second structure edges spaced apart from one another by a minimum distance x. The state of the art enables structures to be produced with minimum spacing of the structure edges from one another of about 30 to 50 nm. By appropriate means in the region of at least the first structure edge, this edge can be impacted with an elastic strain field such that in this region the first edge grows by material transport in the direction of the second structure edge and thus the structure itself is reduced in size.

This can result for example from deposition of a mask structure which produces the elastic strain field in one or in both structure edges. The mask structure can also be employed for structuring the layer. A further possibility is that the layer upon fabrication itself produces this elastic strain field as a result of intrinsic characteristics or possible lattice defects.

The growth of both structure edges is likewise possible, for example, by the use of an appropriately shaped mask structure so that the structure is reduced from both directions by the material transport.

In a further process step, a strain-dependent diffusion or reaction process is effected. These processes have, as a consequence the desired reduction in that in the vicinity of at least the first structure edge in which the elastic strain field is affected, the structure is reduced by material transport from the layer to be structured. The material transport is also possible through diffusion from the substrate outwardly. The growth therefore does not have to be exclusively by material transport from the layer itself.

The method is suitable to reduce previously provided structures in a reproducible manner.

Especially structures with structure edges spaced apart by a distance of only 5, 10, 20, 30 or 40 nm can be provided. Naturally any optional value, especially a value between the stated values, can be provided as well.

In an advantageous refinement of the invention, the strain-dependent diffusion or reaction process can encompass a local oxidation, heat treatment or a specific alloy formation.

By the level of the temperature, and the duration of the diffusion or reaction process, the amount of the material transport and thus the degree of reduction of a given structure in the layer can be reproducibly adjusted to the above mentioned dimensions. Since the effect of the elastic strain field is highly temperature dependent, the temperature for each material used can be suitably chosen for the desired degree of reduction.

In the case of silicides, the diffusion process should include especially an oxidation in an oxygen containing atmosphere.

By heat treatment at appropriate temperatures, in the case of cobalt disilicide as the material for the layer, for example, at 600° C., the strain-dependent diffusion can be effected in a simple manner.

The formation of specific silicides in a strain-dependent reaction process can involve the application of metals, especially cobalt, titanium or nickel, to a silicon substrate at a suitable temperature, for example, at 400 to 900° C. to bring about a reduction of the original structure metallic mono or disilicides thereby result. The layer advantageously should contain at least one metal, especially Co, Ti, Ni, Pd, Pt, W, Ta or Nb, or a silicide or silicides thereof. These metals are appropriate materials, because of their good electric conductivities, for contacts or connecting conductors of electric components, whereby the corresponding silicides are especially advantageous because they provide in silicon technology, high compatibility with silicon.

As the material for the layer, CoSi$_2$ itself is especially suitable. CoSi$_2$ is of great significance in semiconductor technology. It can be structured so that its structure forms first and second structure edges whose spacing can be 50 nm or less. The structures are thus scalable and can have desirable characteristics, for example, as concern conductivities.

Especially advantageous is the use of epitactical cobalt disilicide since this at suitable temperatures can itself generate the desired elastic strain field. By epitactical cobalt disilicide, one understands cobalt disilicide which is applied to a silicon substrate for example in a lattice-matched manner.

As materials for forming the elastic strain field, especially Si$_3$N$_4$ and SiO$_2$, individually or in a layer sequence of a mask structure, can be used. Si$_3$N$_4$ is especially advantageous because of its intrinsic characteristics, it can produce the desired elastic strain field.

As a result, the method of the invention allows at least a one time local reduction of structures which can be produced in accordance with the state of the art with the aid of structuring techniques. The method can also be carried out a multiplicity of times so that structures with smaller dimensions after each time can be produced.

The advantage of the method is in the possibility of reducing structures in the region of the resolution limits of structuring processes as are known from the state of the art. The method is economical and from the point of view of technology involves simple procedures.

BRIEF DESCRIPTION OF THE DRAWING

The invention is described further in conjunction with the accompanying figures and three exemplary embodiments which are described in greater detail.

In the drawing.

SPECIFIC DESCRIPTION

Figure 1:
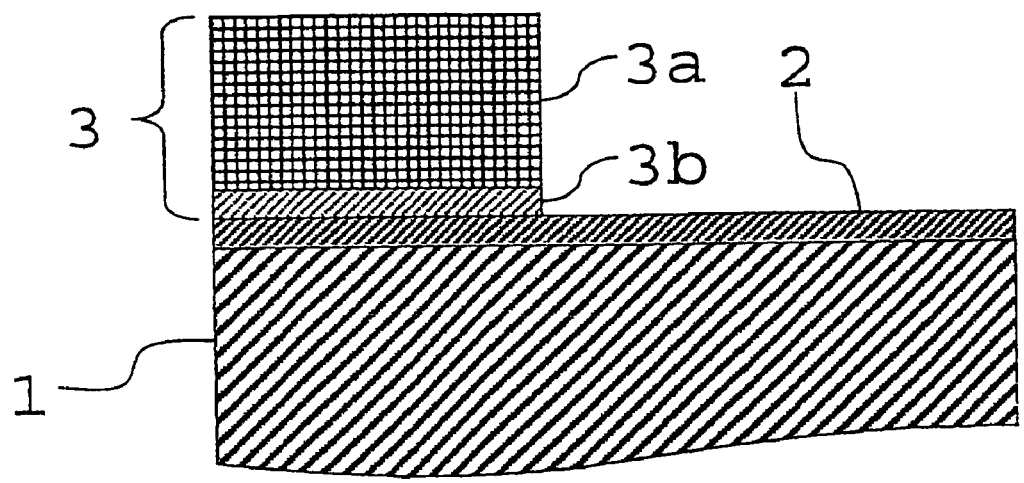
FIG. 1 is a diagrammatic cross sectional view through a substrate and a layer, according to the invention, showing a step in the structuring of the layer.

FIG. 1 shows a cross section through a substrate 1 on whose surface a layer 2 and a mask structure 3 are applied. The mask structure is stored by conventional lithography and encompasses an $Si_3N_4$ layer (3a) and $SiO_2$ layer (3b).

Figure 2:
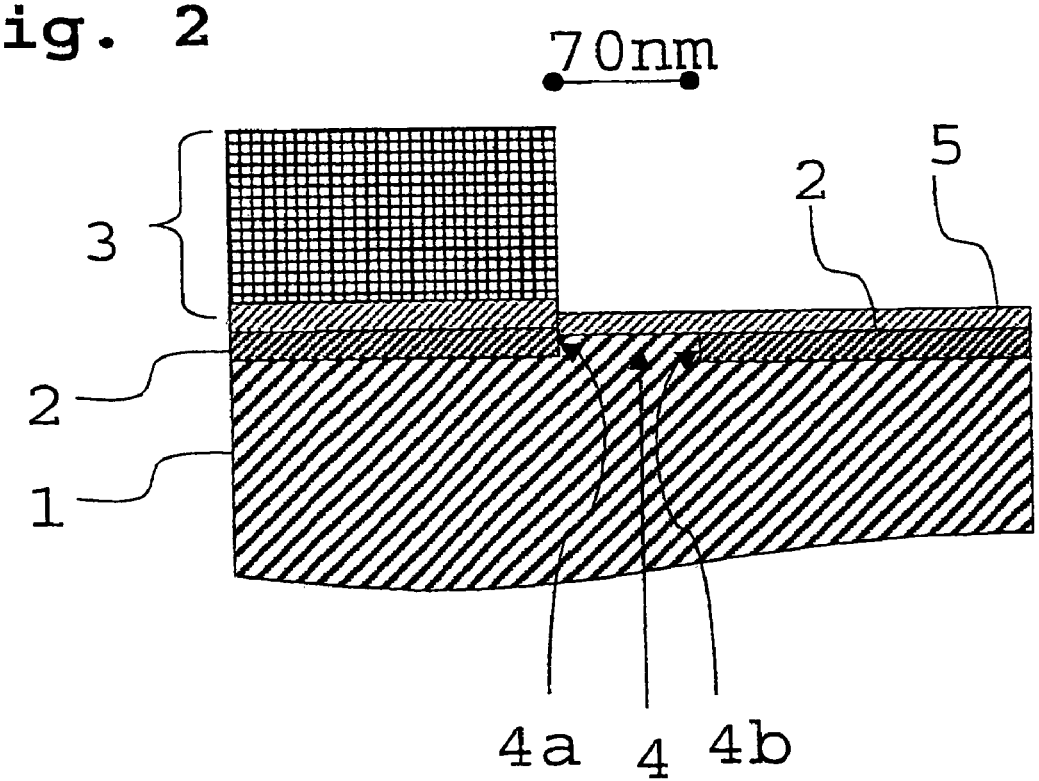
FIG. 2 is a view similar to FIG. 1 showing a further step.
Figure 3:
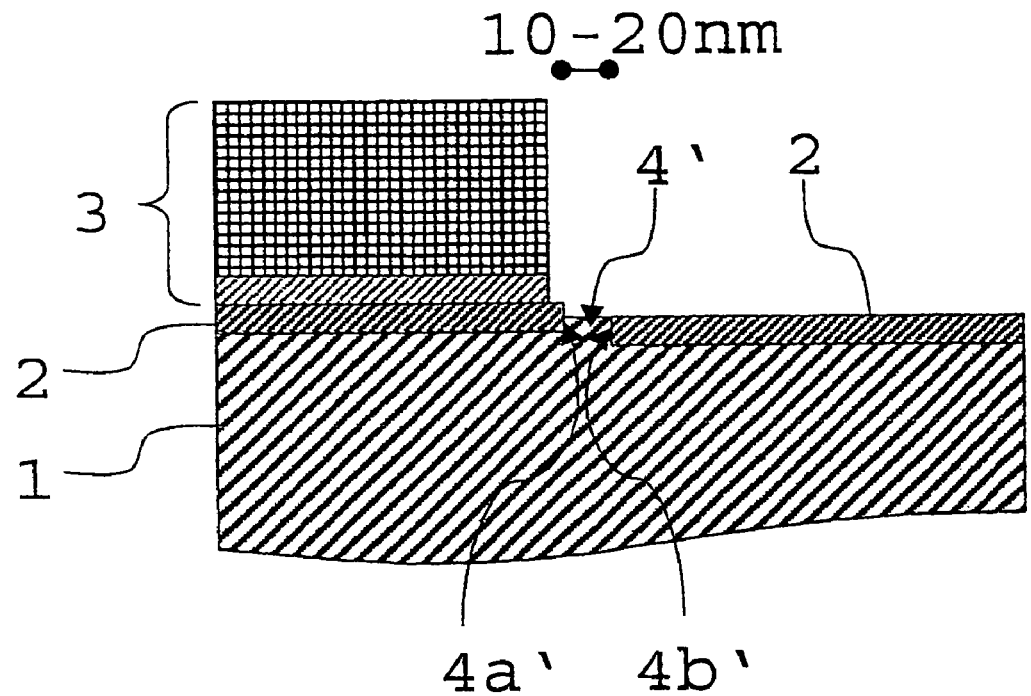
FIG. 3 is another view similar to FIG. 1 showing yet another step.

FIG. 2 shows the cross section of the article of FIG. 1 after an oxidation of a self adjusting structuring process according to the state of the art. The layer 2 separates itself along the edge of the mask structure 3. The result 4 is formed from the substrate and has a first structure edge 4a and a second structure edge 4b which have a spacing of 70 nanometers from one another. Because of the oxidation, a further $SiO_2$ layer arises. This covers the unmasked region of the layer 2 as well as the structure 4. FIG. 3 shows the cross section of the article of FIG. 2 after removal of the $SiO_2$ layer and after a stress-dependent diffusion or reaction process in which the structure 4, because of the material transport from the layer 2 and optionally from the substrate 1, runs together so that the structure 4 is reduced and a structure 4' is formed. The structure edges 4a' and 4b' have a spacing of only about 10 to 20 nanometers.

Figure 4:
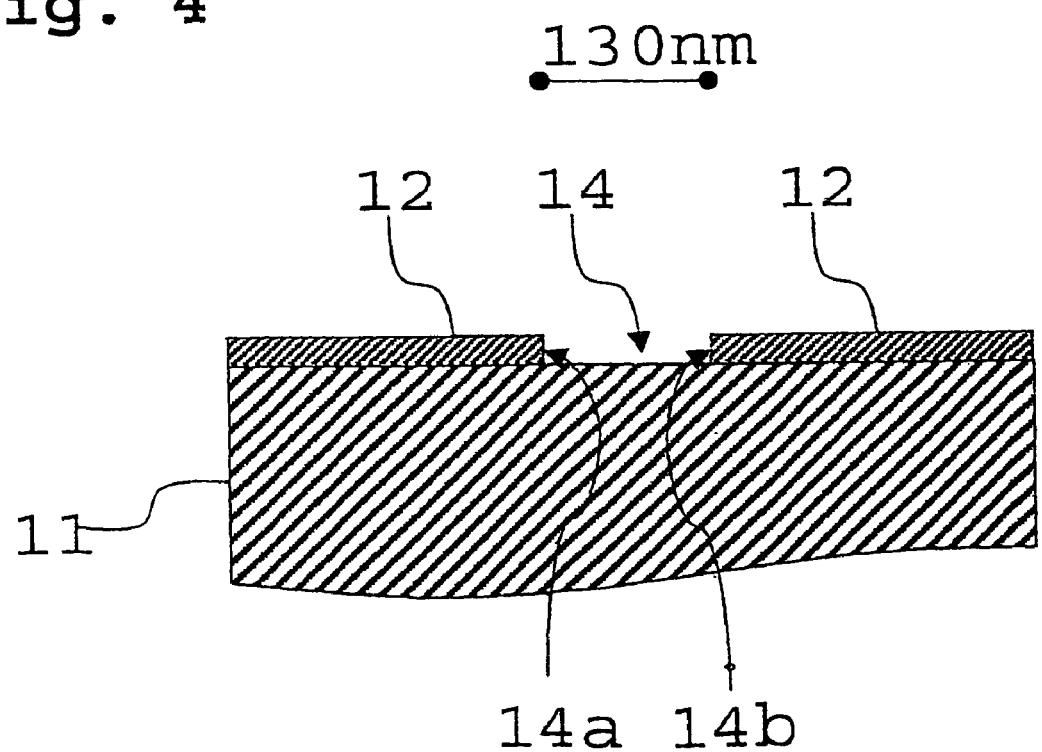
FIG. 4 is a diagrammatic cross sectional view through a substrate and a layer, according to the invention, showing a step in a second embodiment of the invention.

FIG. 4 shows a second embodiment with the cross section of a substrate 11 on whose surface a previously prepared structure layer 12 is provided which is comprised of a pure metal with a structure 14. The structure 14 has a first structure edge 14a and a second structure edge 14b which have a spacing of about 130 nanometers from each other. Structure 14 is produced with the aid of optical lithography and a standard etching process.

Figure 5:
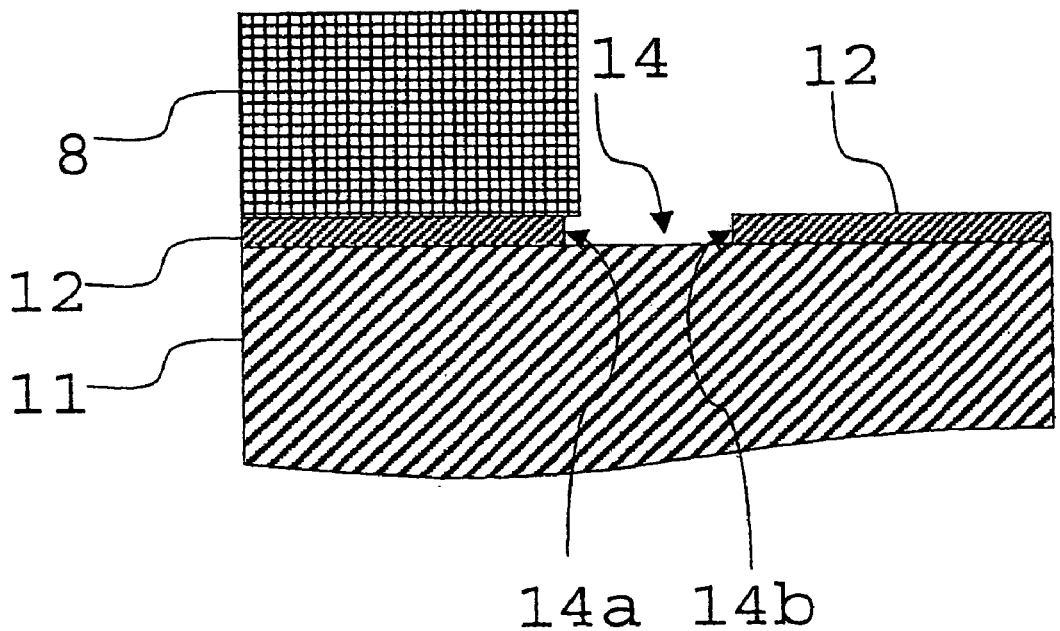
FIGS. 5 and 6 are similar views showing further steps.

FIG. 5 shows the cross section of FIG. 4 after a stress or strain producing layer 8 has been applied and structured with the aid of conventional lithography.

Figure 6:
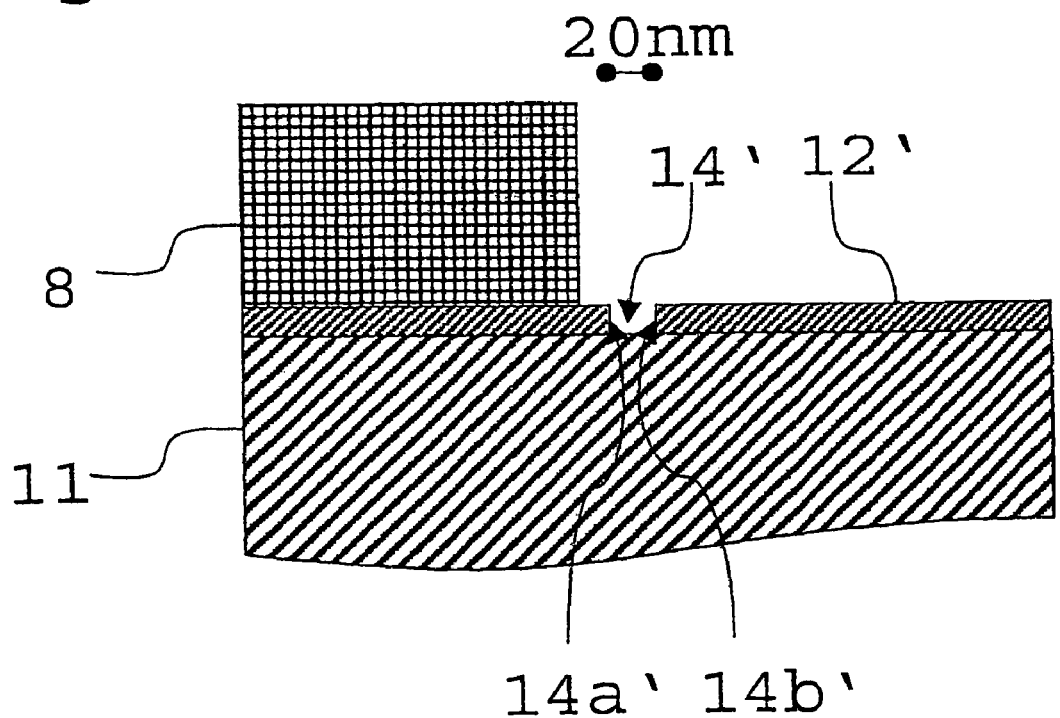

FIG. 6 shows the cross section of FIG. 5 after a strain dependent diffusion process or reaction process has been carried out through which the layer 12 is further structured and, by material transport from the layer itself and optionally from the substrate, runs together so that in the formation of the new layer 12' the structure 14 is reduced and structure 14' is produced. The structure edges 14b' and 14a' have a spacing of only about 20 nanometers.

Figure 7:
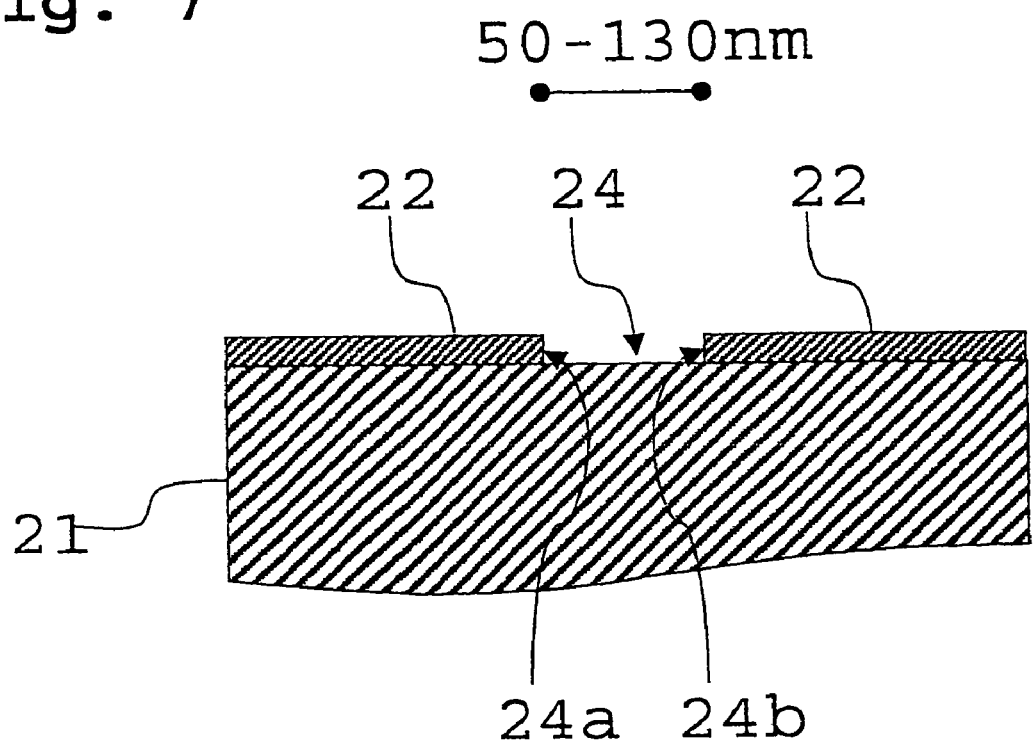
FIG. 7 is a diagrammatic cross sectional view through a substrate and a layer, according to the invention, showing a step in a third embodiment of the invention.

FIG. 7 shows a third embodiment and the cross section of a substrate 21. On the surface of this substrate, there is disposed a previously structured layer 22 with a structure 24. The structure 24 has a first structure edge 24a and a second structure edge 24b.

The structured layer 22 is produced by lithography and itself generates an elastic strain field in the substrate 21.

Figure 8:
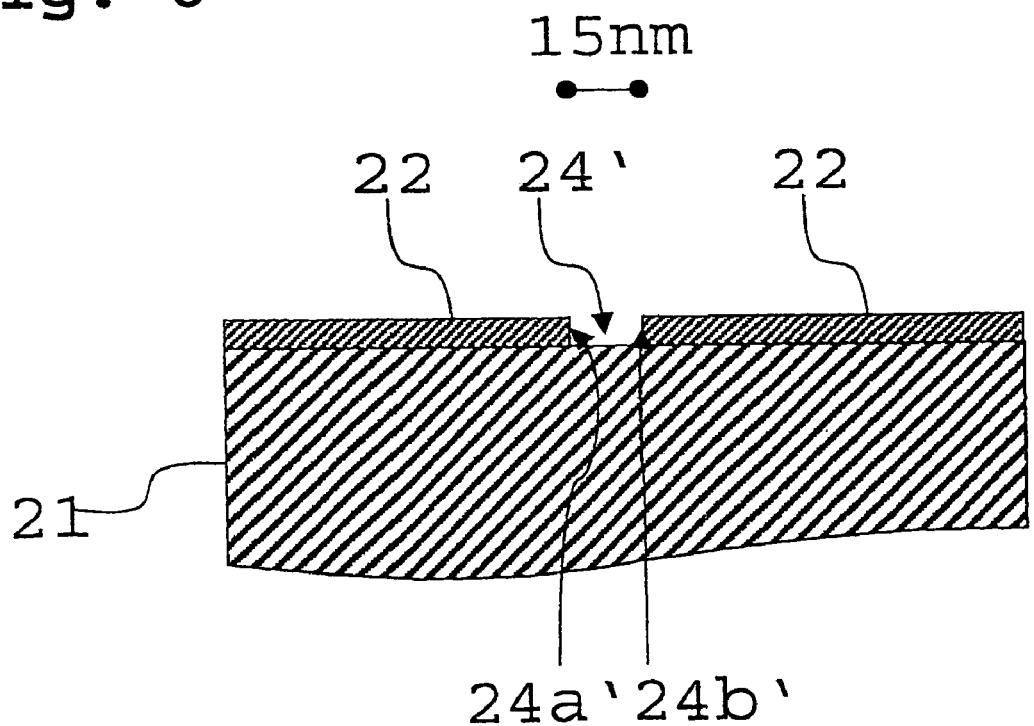
FIG. 8 is a view similar to FIG. 7 showing another step in this third embodiment.

FIG. 8 shows the cross section of FIG. 7 after a strain dependent diffusion or reaction process has been carried out. The left of the structure 24 is reduced by material transport from the layer 22 and optionally also from the substrate so that the structure 24' is formed. The structure edges 24a' and 24b' have a spacing of only about 15 nanometers.

According to the first exemplary embodiment, a cobalt silicide layer 2 with a thickness of about 20 to 30 nanometers, is epitactically applied to a silicon substrate.

Thereafter, a mask structure, comprised of a 300 nanometer thick $Si_3N_4$ layer 3a and a 20 nanometer thick $SiO_2$ layer 3b is deposited and structured with the aid of conventional optical lithography (1). On the edges of the thus resulting mark structure 3, there arises, because of the intrinsic strain in the nitride layer, an elastic strain field in the layer lying there under and in the substrate.

The entire layer sequence is oxidized, whereby based upon an anisotropic diffusion in the elastic strain field, at the edges of the nitride layer, the silicide layer separates in a self adjusting manner and produces the structure 4 with a length of about 70 nanometers (FIG. 2). The structure 4 is produced out of the material of the substrate and has two structure edges 4a and 4b. This oxidation step is usually carried out at temperatures around 1000° C. which is necessary in order to produce a homogeneous, uniform structuring. The further silicon oxide layer 5 which is produced by the oxidation in the unmasked regions is again removed by treatment with a hydrofluoric acid solution.

In a subsequent step, the entire layer sequence is oxidized at a reduced temperature of around 600° C. wet in water vapor for about 2 to 3 hours. The temperature is so selected that as a consequence in the change in the strain relations resulting during this oxidation step, the structure 4 is reduced (FIG. 3). The two structure edges then have a spacing of only about 10 to 20 nm. The material transport and the consequent growth is a consequence of the magnitude of the elastic strain field of both structure edges through anisotropic diffusion of the cobalt atoms. The diffusion direction is thereby rotated, because of the altered strain relations in the cobalt atoms.

The structure 4 or 4' can in a plan view, have any possible structure configuration, especially a through going or passage-shaped structure. However, it is possible in exactly the same way to provide a stepped structure or any other multiedged structure in the broadest sense depending upon the configuration of the mask structure 3.

In the second exemplary embodiment, a pure metal layer 12 of cobalt is applied to a silicon substrate 11 and structured with the aid of lithography so that the structure edges 14a and 14b arises. The structure edges have a spacing of about 130 nm from one another (FIG. 4).

A part of the layer 12, a mask structure 8 is deposited with the aid of optical lithography (FIG. 5). In FIG. 5, the edge of the mask structure 8 slightly overlaps the structure edge 14a. On the edges of the mask structure 8, an elastic strain-field develops in the underlying layer and in the substrate. In the subsequent strain dependent reaction process, the structure 14 is reduced by suitable temperature through anisotropic diffusion of silicon and cobalt in the form of material transport in the strain field determined by the mask structure (FIG. 6) so that the structure 14' is produced. The structure edges grow as the dimensioning previously given indicates as in Example 1 from both sides toward one another to a spacing of only about 20 nm. In the case of cobalt as the starting material of layer 12, as a consequence of silicidization the desired cobalt disilicide layer 12' is formed. It is equally possible to apply a mask structure to both structure edges, that is in which the mask structure slightly overlaps both of the structure edges. Above all, when a larger structure, for example, one in the micron range, is to be reduced, in which the elastic strain field of a mask structure does not reach to the second structure edge, this system has been found to be suitable. In this case, a more rapid reduction can be achieved.

Instead of a cobalt disilicide layer, a corresponding silicide of the elements Ti, Ni, Pd, Pt, W, Ta or Nb can be produced when the corresponding metal has previously been deposited.

In addition, layer sequences of a plurality of these mentioned metals as layers which are formed to be structured, can be used.

As in the exemplary embodiment 2, one starts directly from, for example, a cobalt disilicide layer as the layer 12, a wet oxidation at 600° C. can be carried out to reduce the structure 14 to 1 structure 14'.

In a third exemplary embodiment, a layer of epitactic cobalt disilicide 22 with a structure 24 is disposed on a substrate 21. The structure 24 has structure edges 24a and 24b with a spacing of 50 to 130 nm (FIG. 7). The cobalt disilicide layer 22 has the property that it itself generates an elastic strain field in the substrate 21. This layer is further structured. By suitable thermal treatment, for example, by wet oxidation at 600° C., the structure 24 is reduced by anisotropic diffusion of cobalt in the form of material transport in the self-generated strain field (FIG. 8) so that the structure 24' results. The structure edges 24a' and 24b' have a spacing of only about 15 nm. The methods indicated in the three mentioned exemplary embodiments are highly reproducible.

The structures produced in accordance with the invention can be used to produce an electrical, optical, optoelectronic or sensory component.

The invention claimed is:

1. A method of producing a layer on a substrate, comprising the steps of:
    initially forming a layer on a substrate and providing in said layer at least one structure with first and second structure edges separated from one another by a certain minimum distance;
    in a region of at least said first structure edge applying an elastic strain field; and
    effecting a strain-dependent diffusion or reaction process encompassing an oxidation for a period sufficient to reduce a spacing between said edges by a fixed amount below said certain minimum distance.

2. The method according to claim 1 wherein, prior to the strain dependent diffusion or reaction, the layer is oxidized.

3. The method according to claim 1 wherein the strain-dependent diffusion or reaction process encompasses a diffusion or heat treatment or specific alloy formation.

4. The method according to claim 1 wherein the layer is structured with the aid of optical lithography or by a self-adjusting process.

5. The method according to claim 1 wherein the process is carried out for a sufficient length of time until the structure edges are spaced apart by a spacing below 50 nm.

6. The method according to claim 1 wherein the spacing of the structure edges is 5, 10, 20, 30 or 40 nm or a value lying there between.

7. The method according to claim 1 at least one metal selected from the group which consists of Co, Ti, Ni, Pd, Pt, W, Ta and Nb or a silicide thereof is a starting material for the layer.

8. The method according to claim 1 wherein $CoSi_2$ is the material of the layer.

9. The method according to claim 1 wherein an elastic strain field is also applied in a region of said second structure edge.

10. The method according to claim 1 wherein a mask structure is applied for producing the elastic strain field.

11. The method according to claim 10 wherein the mask structure is composed of $Si_3N_4$ and/or $SiO_2$.

12. The method according to claim 10 wherein $SiO_2$—$Si_3N_4$ form a layer sequence of the mask structure for producing the elastic strain field.

13. The method according to claim 10 wherein the mask structure overlaps slightly the region of at least one of the structure edges.

14. The method according to claim 10 the elastic strain field is produced by fabrication of the layer.

15. An electrical, optical, optoelectronic or sensory component with a structured layer fabricated by the steps of:
    initially forming a layer on a substrate and providing in said layer at least one structure with first and second structure edges separated from one another by a certain minimum distance;
    in a region of at least said first structure edge applying an elastic strain field; and
    effecting a strain-dependent diffusion or reaction process encompassing an oxidation for a period sufficient to reduce a spacing between said edges by a fixed amount below said certain minimum distance.

* * * * *